(12) United States Patent
Kumar et al.

(10) Patent No.: US 7,876,132 B1
(45) Date of Patent: Jan. 25, 2011

(54) FLOATING WELL CIRCUIT OPERABLE IN A FAILSAFE CONDITION AND A TOLERANT CONDITION

(75) Inventors: Pankaj Kumar, Karnataka (IN);
Pramod Elamannu Parameswaran, Karnataka (IN); Makeshwar Kothandaraman, Whitehall, PA (US); Vani Deshpande, Karnataka (IN); John Kriz, Palmerton, PA (US)

(73) Assignee: LSI Corporation, Milpjtas, CA (US)

( * ) Notice: Subject to any disclaimer, the term of this patent is extended or adjusted under 35 U.S.C. 154(b) by 0 days.

(21) Appl. No.: 12/580,280

(22) Filed: Oct. 16, 2009

(51) Int. Cl.
*H03B 1/00* (2006.01)

(52) U.S. Cl. .................. 327/108; 327/112; 327/534; 326/14

(58) Field of Classification Search .......... 327/108–109, 327/112, 379–381, 530, 534, 535, 537; 365/158.01, 365/158.02, 158.07; 326/14, 81–83
See application file for complete search history.

(56) References Cited

U.S. PATENT DOCUMENTS

| 7,276,957 | B2 | 10/2007 | Bhattacharya et al. |
| 7,362,145 | B2 | 4/2008 | Takemura et al. |
| 2006/0170054 | A1 | 8/2006 | Mergens et al. |
| 2009/0027089 | A1 | 1/2009 | Hebenstreit |

*Primary Examiner*—An T Luu
(74) *Attorney, Agent, or Firm*—Raj Abhyanker, P.C.

(57) ABSTRACT

A circuit includes a first comparator block configured to output a voltage equal to a higher of a supply voltage and a bias voltage, a second comparator block configured to output a voltage equal to a higher of the bias voltage and an external voltage supplied through an Input/Output (IO) pad, and a third comparator block configured to output a voltage equal to a higher of the output of the first comparator block and the output of the second comparator block. A voltage across one or more constituent active element(s) of each of the first comparator block, the second comparator block, and the third comparator block is within an upper tolerable limit thereof during each of a normal operation, a failsafe operation, and a tolerant operation.

20 Claims, 9 Drawing Sheets

FLOATING WELL CIRCUIT OPERABLE IN A FAILSAFE CONDITION AND A TOLERANT CONDITION

FIELD OF TECHNOLOGY

This disclosure relates generally to electronic circuits and, more particularly, to a method, an apparatus, and a system to realize a floating well (FW) circuit capable of operating in a failsafe condition and a tolerant condition.

BACKGROUND

A buffer circuit (e.g., I/O buffer) may interface the core circuitry of a Metal-Oxide-Semiconductor (MOS) Integrated Circuit (IC) with external Input/Output (IO) circuits. The external voltage may be supplied to an output stage of the buffer circuit through an IO pad. As the operating voltage level of constituent active elements of the core circuitry may be low (e.g., 1.8 Volts (V)) compared to the operating voltage level (e.g., 3.3 V, 5V) of the external IO circuit, the interfacing of the core circuitry with external IO circuits may lead to the constituent active elements (e.g., MOS transistors) of the core circuitry being stressed.

The stress on the constituent active elements of the core circuitry may lead to a decrease in reliability of the active elements, thereby hastening a potential failure of the core circuitry.

SUMMARY

Disclosed are a method, an apparatus, and a system to realize a floating well (FW) circuit capable of operating in a failsafe condition and a tolerant condition.

In one aspect, a circuit includes a first comparator block configured to output a voltage equal to a higher of a supply voltage and a bias voltage, a second comparator block configured to output a voltage equal to a higher of the bias voltage and an external voltage supplied through an Input/Output (IO) pad, and a third comparator block configured to output a voltage equal to a higher of the output of the first comparator block and the output of the second comparator block. A voltage across one or more constituent active element(s) of each of the first comparator block, the second comparator block, and the third comparator block is within an upper tolerable limit thereof during each of a normal operation, a failsafe operation, and a tolerant operation.

The failsafe operation is a mode where the supply voltage is zero, and the tolerant operation is a mode where the external voltage supplied through the IO pad varies from zero to a value higher than the supply voltage.

In another aspect, a method includes outputting a higher of a supply voltage and a bias voltage through a first comparator block, outputting a higher of the bias voltage and an external voltage supplied through an IO pad through a second comparator block, and outputting a higher of the output of the first comparator block and the output of the second comparator block through a third comparator block. A voltage across one or more constituent active element(s) of each of the first comparator block, the second comparator block, and the third comparator block is within an upper tolerable limit thereof during each of a normal operation, a failsafe operation, and a tolerant operation.

The failsafe operation is a mode where the supply voltage is zero, and the tolerant operation is a mode where the external voltage supplied through the IO pad varies from zero to a value higher than the supply voltage.

In yet another aspect, a buffer circuit includes an output stage that includes a floating well circuit. The floating well circuit includes a first comparator block configured to output a voltage equal to a higher of a supply voltage and a bias voltage, a second comparator block configured to output a voltage equal to a higher of the bias voltage and an external voltage supplied through an IO pad, and a third comparator block configured to output a voltage equal to a higher of the output of the first comparator block and the output of the second comparator block. A voltage across one or more constituent active element(s) of each of the first comparator block, the second comparator block, and the third comparator block is within an upper tolerable limit thereof during each of a normal operation, a failsafe operation, and a tolerant operation.

The failsafe operation is a mode where the supply voltage is zero, and the tolerant operation is a mode where the external voltage supplied through the IO pad varies from zero to a value higher than the supply voltage. The output voltage of the third comparator block of the floating well circuit is configured to be applied to a substrate of a constituent active element of the output stage of the buffer circuit.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to realize a floating well (FW) circuit capable of operating in a failsafe condition and a tolerant condition. Although the present embodiments have been described with reference to specific example embodiments, it will be evident that various modifications and changes may be made to these embodiments without departing from the broader spirit and scope of the various embodiments.

Figure 1:
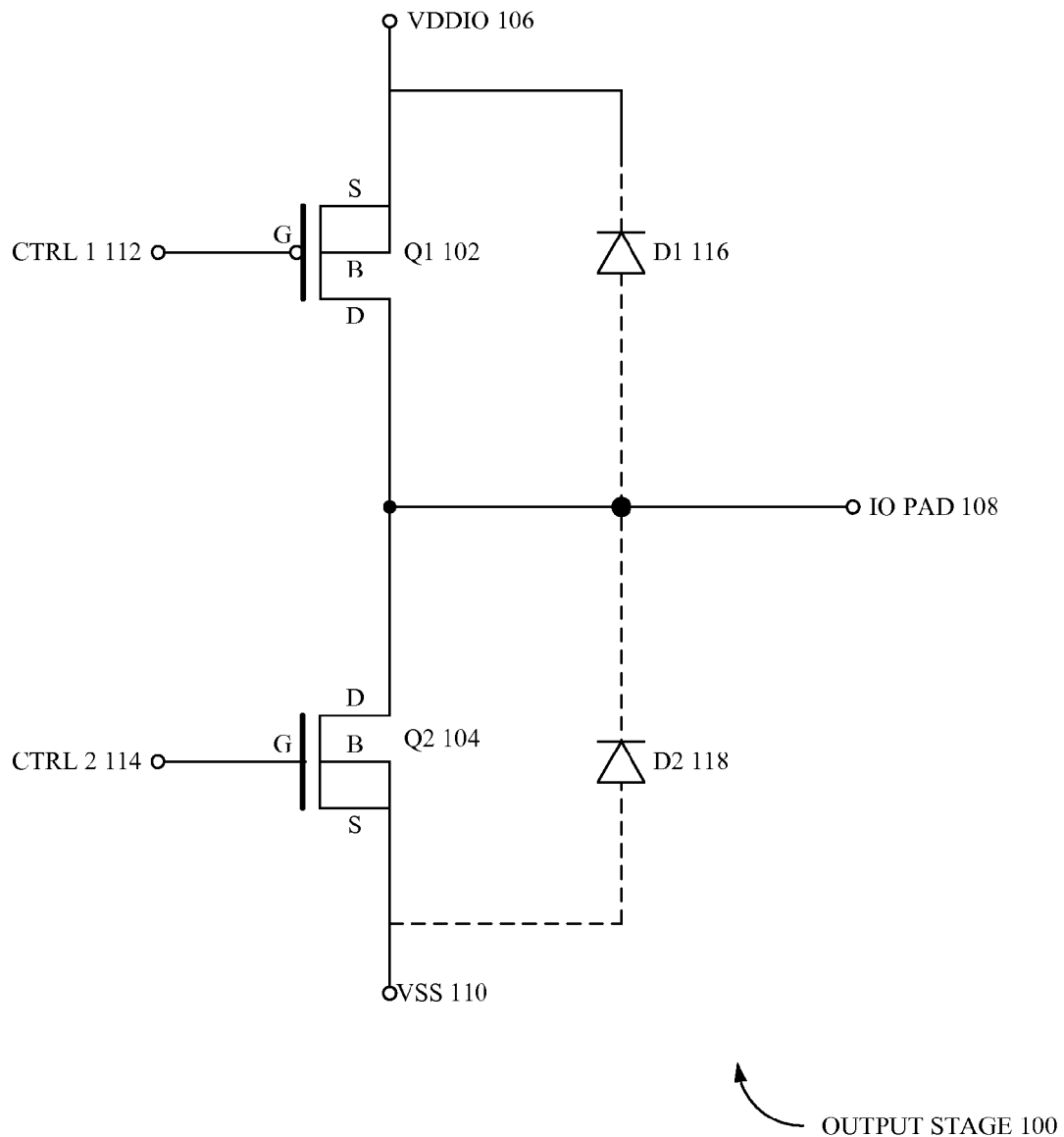
FIG. 1 is a schematic view of an output stage of a buffer circuit, according to one or more embodiments.

FIG. 1 shows a schematic view of an output stage 100 of a buffer circuit, according to one or more embodiments. In one or more embodiments, the output stage 100 may include a positive channel Metal-Oxide-Semiconductor (PMOS) transistor $Q_1$ 102 and a negative channel MOS (NMOS) transistor $Q_2$ 104. In one or more embodiments, the source (S) terminal of $Q_1$ 102 may be connected to a supply voltage $V_{DDIO}$ 106, and the source (S) terminal of $Q_2$ 104 may be connected to a supply voltage $V_{SS}$ 110. The bulk (B) terminals of the transistors ($Q_1$ 102, $Q_2$ 104) may be shorted with the source (S) terminals thereof to connect the bulk (B) terminals of the transistors ($Q_1$ 102, $Q_2$ 104) also to $V_{DDIO}$ 106 and $V_{SS}$ 110 respectively. The drain (D) terminals of $Q_1$ 102 and $Q_2$ 104 may be connected to one another, as shown in FIG. 1.

In one or more embodiments, an external voltage from an Input/Output (IO) pad 108 may be supplied to each of the drain (D) terminals of $Q_1$ 102 and $Q_2$ 104. In one or more embodiments, gate (G) terminals of the transistors ($Q_1$ 102, $Q_2$ 104) may be driven by control signals (CTRL1 112 and CTRL2 114) generated from a control circuit of the buffer circuit. In one or more embodiments, when the buffer circuit operates in a tolerant mode, where the IO pad 108 voltage may be higher than the supply voltage, $V_{DDIO}$ 106, the parasitic diode $D_1$ 116, shown in FIG. 1 as being associated with $Q_1$ 102, may be turned ON, leading to there being a direct path between the IO pad 108 voltage and the supply voltage $V_{DDIO}$ 106. For example, $V_{DDIO}$ 106 may be 1.8 volts (V), and IO pad 108 voltage may be 3.465 V (3.3 V+5% tolerance). The turning ON of $D_1$ 116 may lead to the conducting of a large current, which, in turn, may cause large leakage currents to flow. FIG. 1 also shows the parasitic diode $D_2$ 118 associated with $Q_2$ 104.

Figure 2:
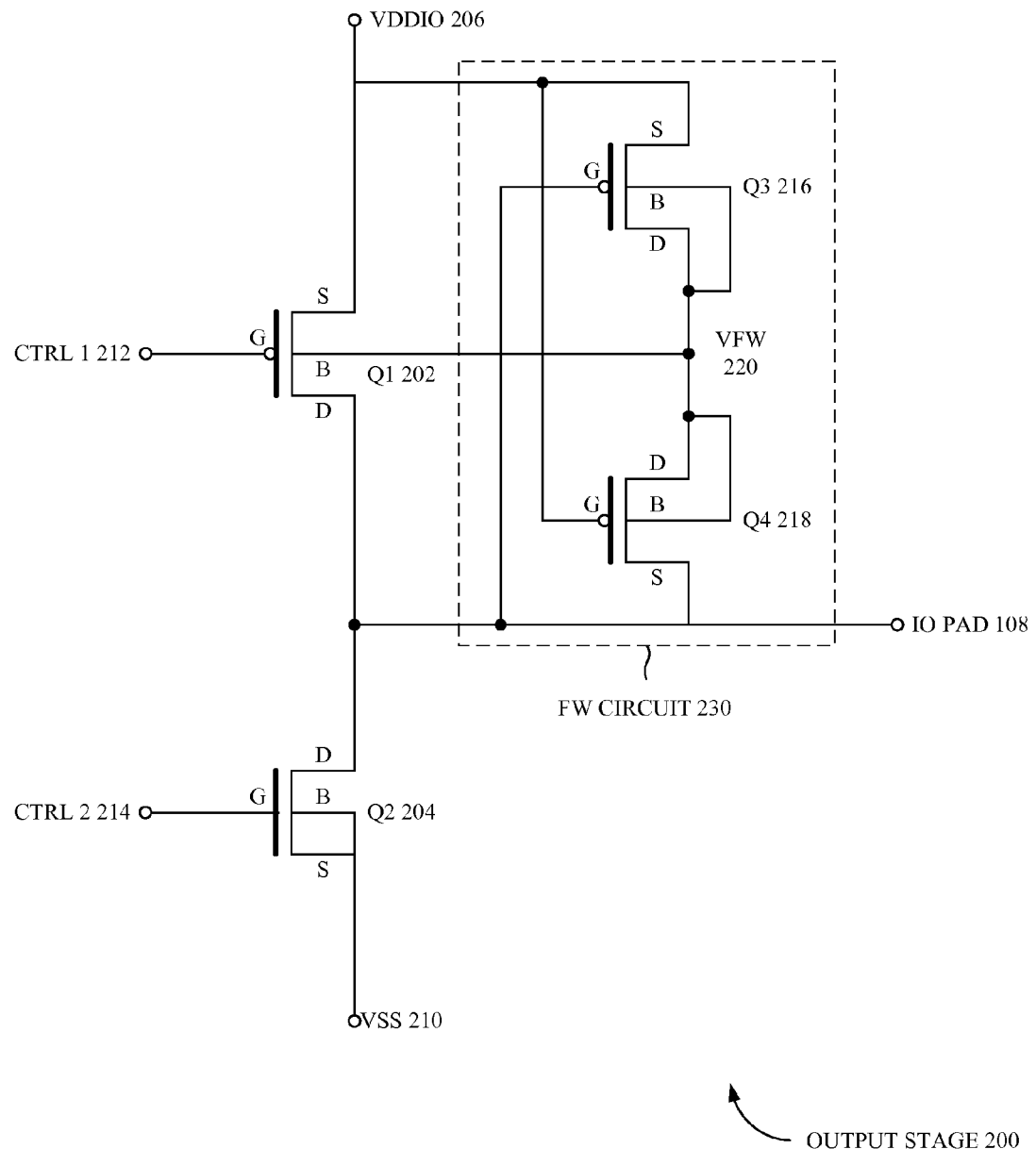
FIG. 2 is a schematic view of a floating well (FW) circuit, shown as being a part of the output stage of the buffer circuit, according to one or more embodiments.

FIG. 2 shows a FW circuit 230 as part of the output stage 200 of the buffer circuit, according to one or more embodiments. $V_{DDIO}$ 206, $V_{SS}$ 210, CTRL1 212, CTRL2 214, $Q_1$ 202, $Q_2$ 204, and IO pad 208 voltage are analogous to $V_{DDIO}$ 106, $V_{SS}$ 110, CTRL1 112, CTRL2 114, $Q_1$ 102, $Q_2$ 104, and IO pad 108 voltage of FIG. 1. In one or more embodiments, $Q_1$ 202 may be placed in a FW, as shown in FIG. 2, which has the capability to select the higher of $V_{DDIO}$ 206 and the IO pad 208 voltage.

In one or more embodiments, the FW circuit 230 includes a PMOS transistor $Q_3$ 216 whose source (S) terminal may be connected to $V_{DDIO}$ 206 and the gate (G) terminal of another PMOS transistor $Q_4$ 218. In one or more embodiments, the source (S) terminal of $Q_4$ 218 may be connected to the gate (G) terminal of $Q_3$ 216 and the IO pad 208 voltage. The drain (D) terminals of both the transistors ($Q_3$ 216, $Q_4$ 218) of the FW circuit 230 may be connected to one another. In one or more embodiments, the bulk (B) terminal of each transistor ($Q_3$ 216, $Q_4$ 218) may be connected to the drain (D) terminal thereof. In one or more embodiments, the output of the FW circuit, $V_{FW}$ 220, taken at the drain-drain path of the PMOS transistors ($Q_3$ 216, $Q_4$ 218), may be fed to the bulk (B) terminal, i.e., substrate, of $Q_1$ 202. In one or more embodiments, the feeding of $V_{FW}$ 220 to the bulk (B) terminal of $Q_1$ 202 may prevent the forward biasing of the parasitic diode associated with $Q_1$ 202.

In one or more embodiments, when $V_{DDIO}$ 206 is much higher than the IO pad 208 voltage, $Q_3$ 216 may be turned ON and $Q_4$ 218 may be turned OFF, leading to $V_{FW}$ 220 being substantially equal to $V_{DDIO}$ 206. In one or more embodiments, when IO pad 208 voltage is much higher than $V_{DDIO}$ 206, $Q_4$ 218 may be turned ON and $Q_3$ 216 may be turned OFF, leading to $V_{FW}$ 220 being substantially equal to the IO pad 208 voltage. Therefore, $V_{FW}$ 220 may be the higher of $V_{DDIO}$ 206 and the IO pad 208 voltage.

However, in one or more embodiments, when $V_{DDIO}$ 206 is zero, the entire IO pad 208 voltage may be present across the gate (G) oxide of $Q_3$ 216. In one or more embodiments, as the gate oxide thickness in $Q_3$ 216 may be very less to suit performance requirements, application of a high IO pad 208 voltage may reduce reliability of $Q_3$ 216. Moreover, in one or more embodiments, when the IO pad 208 voltage is within a threshold voltage ($V_T$) above and below $V_{DDIO}$ 206, $Q_3$ 216 and $Q_4$ 218 may both be turned OFF, leading to a fluctuating state of $V_{FW}$ 220.

Figure 3:
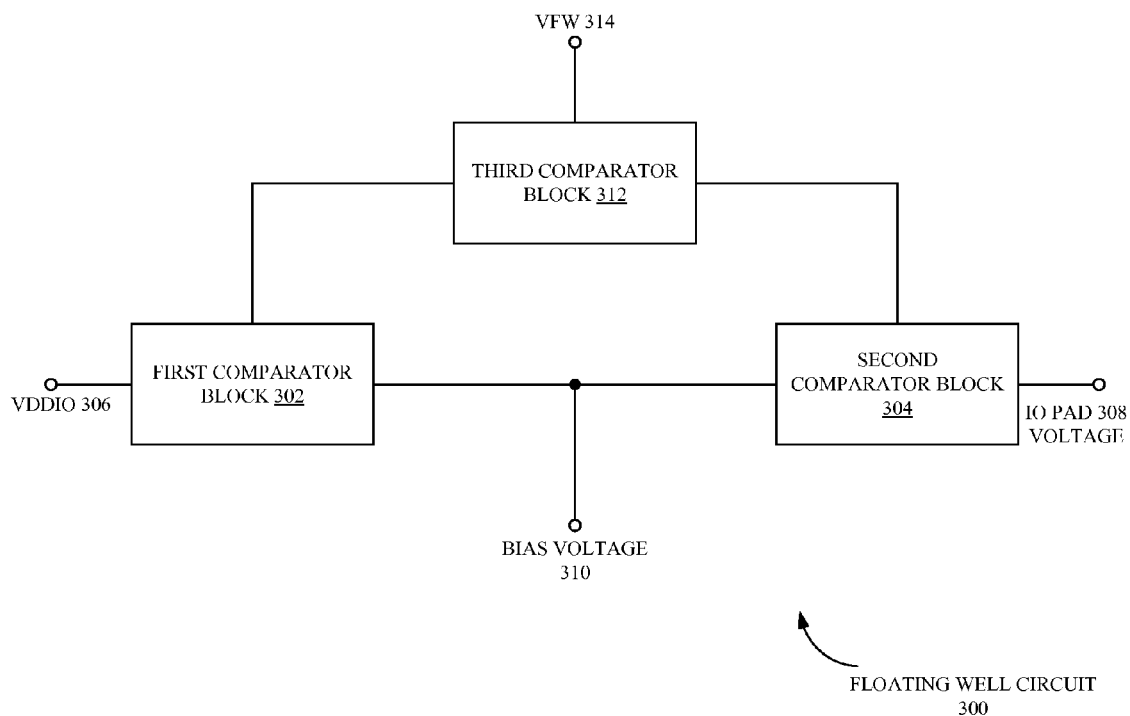
FIG. 3 is a system view of a FW circuit, according to one or more embodiments.

FIG. 3 shows a system view of a FW circuit 300, according to one or more embodiments. In one or more embodiments, the floating well circuit 300 may include a first comparator block 302, with the supply voltage $V_{DDIO}$ 306 and the bias voltage 310 as inputs thereof, and a second comparator block 304, with the IO pad 308 voltage and the bias voltage 310 as inputs thereof. In one or more embodiments, the outputs of both the first comparator block 302 and the second comparator block 304 may serve as the inputs of the third comparator block 312, as shown in FIG. 3. Here, $V_{DDIO}$ 306 and IO pad 308 voltage are analogous to $V_{DDIO}$ (106, 206) and IO pad (108, 208) voltage in FIG. 1 and FIG. 2. In one or more embodiments, the output of the third comparator block 312, $V_{FW}$ 314, may be fed to the bulk (B) terminal of $Q_1$ 202 of FIG. 2, with FW circuit 230 being replaced by FW circuit 300.

In one or more embodiments, $V_{DDIO}$ 306 may be higher than the bias voltage 310 during a normal operation and, therefore, $V_{DDIO}$ 306 may be the output of the first comparator block 302. In one or more embodiments, the bias voltage 310 may be controllably generated to be a fraction of $V_{DDIO}$ 306 (e.g., 0.55$V_{DDIO}$). In one or more embodiments, the IO pad 308 voltage may swing from 0 to $V_{DDIO}$ 306. In one or more embodiments, when the IO pad 308 voltage is low, the output of the second comparator block 304 may be equal to the bias voltage 310. Therefore, the output of the third comparator block 312, $V_{FW}$ 314, may be the higher of $V_{DDIO}$ 306 (output of the first comparator block 302) and the bias voltage 310 (output of the second comparator block 304). This implies that $V_{FW}$ 314 may be equal to $V_{DDIO}$ 306 when the IO pad 308 voltage is low during the normal operation.

In one or more embodiments, when the IO pad 308 voltage is high, the output of the second comparator block 304 may be equal to the IO pad 308 voltage. Therefore, the output of the third comparator block 312 may be equal to the higher of $V_{DDIO}$ 306 (output of the first comparator block 302) and the IO pad 308 voltage (output of the second comparator block 304). This implies that $V_{FW}$ 314 may be equal to $V_{DDIO}$ 306 when the pad 308 voltage is high during the normal operation.

In one or more embodiments, $V_{FW}$ 314 may be equal to $V_{DDIO}$ 306 during the normal operation, regardless of the value of the IO pad 308 voltage, which may swing from 0 to $V_{DDIO}$ 306.

In one or more embodiments, $V_{DDIO}$ 306 may be equal to 0 during a failsafe operation. In one or more embodiments, the bias voltage 310 may then be derived from the IO pad 308 voltage as per example Equation 1 as:

$$V_B = IO_{PAD} - 2V_T \quad (1)$$

$V_B$ where is the bias $IO_{PAD}$ voltage 310, is the IO pad 308 $V_T$ voltage, and is threshold voltage of a constituent active element of the second comparator block 304. In example Equation 1, two constituent active elements of the second comparator block 304 are considered.

In one or more embodiments, when the IO pad 308 voltage may be low, the output of the third comparator block 312, $V_{FW}$ 314, may be low. In one or more embodiments, when the IO pad 308 voltage may be high, the output of the second comparator block 304 may be equal to the IO pad 308 voltage. In one or more embodiments, the output of the first comparator block 302 may then be equal to the bias voltage 310. The bias voltage 310, as described in Equation 1, may need to be controlled to be less than an upper tolerable limit of each of the constituent active elements of the first comparator block 302. For example, each constituent active element of the first comparator block 302 may be a 1.8 V device and, therefore, the bias voltage 310 may need to be controlled to be less than ~2V (1.8V+10% upper tolerable limit) to ensure the safety of each constituent element of the first comparator block 302.

In one or more embodiments, the IO pad 308 voltage may be higher than $V_{DDIO}$ 306 during a tolerant mode of operation. In one or more embodiments, when the IO pad 308 voltage is higher than $V_{DDIO}$ 306, the bias voltage 310 may track the IO pad 308 voltage as per Equation 1. Here, the output of the second comparator block 304 may be equal to the IO pad 308 voltage. In one or more embodiments, the output of the first comparator block 302 may be equal to bias voltage 310 or $V_{DDIO}$ 306, depending on magnitudes thereof. In one or more embodiments, as the IO pad 308 voltage is higher than $V_{DDIO}$ 306, as discussed above, the output of the third comparator block 312, $V_{FW}$ 314, may be equal to the IO pad 308 voltage.

In one or more embodiments, when $V_{DDIO}$ 306 is higher than the IO pad 308 voltage, the output of the first comparator block 302 may be equal to $V_{DDIO}$ 306, and the output of the second comparator block 304 may be equal to IO pad 308 voltage. In one or more embodiments, the output of the third comparator block 312, $V_{FW}$ 314, may then be equal to $V_{DDIO}$ 306.

Therefore, in one or more embodiments, the output of the third comparator block 312, $V_{FW}$ 314, may be equal to $V_{DDIO}$ 306 or IO pad 308 voltage during the tolerant operation, depending on whichever one of $V_{DDIO}$ 306 and the IO pad 308 voltage is higher.

Figure 4:
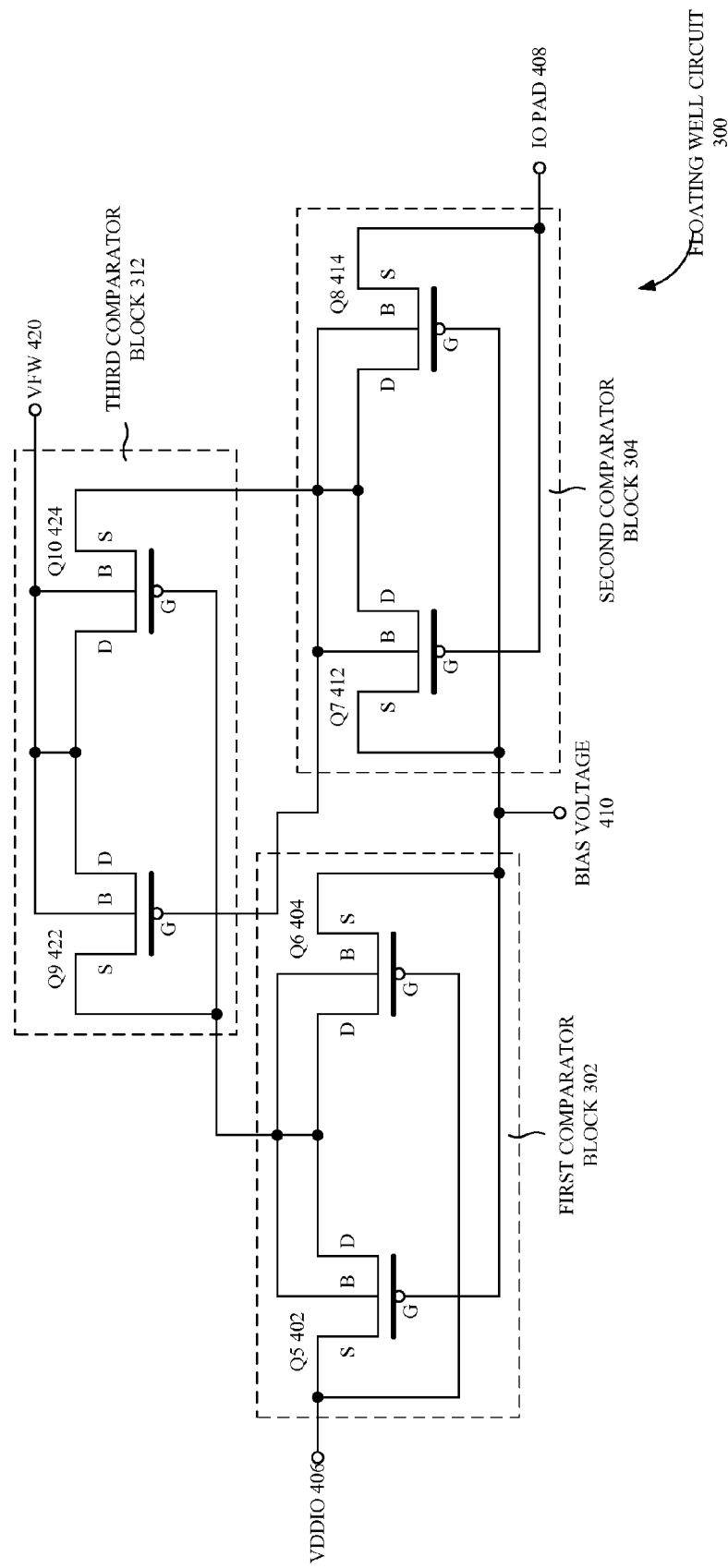
FIG. 4 is a schematic view of a transistor implementation of the FW circuit of FIG. 3, according to one or more embodiments.

FIG. 4 shows a transistor implementation of the FW circuit 300 of FIG. 3, according to one or more embodiments. In one or more embodiments, each of the first comparator block 302, the second comparator block 304, and the third comparator block 312 may be formed from a PMOS transistor pair ($Q_5$ 402 and $Q_6$ 404, $Q_7$ 412 and $Q_8$ 414, $Q_9$ 422 and $Q_{10}$ 424), where the source (S) terminals of the individual transistor pairs are configured to receive $V_{DDIO}$ 406 and the bias voltage 410 ($Q_5$ 402 and $Q_6$ 404), the IO pad 408 voltage and the bias voltage 410 ($Q_7$ 412 and $Q_8$ 414), and the output of the first comparator block 302 and the output of the second comparator block 304 ($Q_9$ 422 and $Q_{10}$ 424) respectively. Here, $V_{DDIO}$ 406, bias voltage 410, and IO pad 408 voltage are analogous to $V_{DDIO}$ 306, bias voltage 310, and IO pad 308 voltage of FIG. 3.

In one or more embodiments, the drain (D) terminals and the bulk (B) terminals of the individual transistor pairs ($Q_5$ 402 and $Q_6$ 404, $Q_7$ 412 and $Q_8$ 414, $Q_9$ 422 and $Q_{10}$ 424) may be configured to be connected to each other. In one or more embodiments, the bulk-bulk path and the drain-drain path in the individual transistor pairs ($Q_5$ 402 and $Q_6$ 404, $Q_7$ 412 and $Q_8$ 414, $Q_9$ 422 and $Q_{10}$ 424) may be connected to one another, as shown in FIG. 4, to enable a path for the output of the individual comparator blocks (302, 304, 312). In one or more embodiments, the output of the third comparator 312 block may be equal to $V_{FW}$ 420 (same as $V_{FW}$ 314 of FIG. 3).

It is obvious to one of ordinary skill in the art that the source (S) terminal and drain (D) terminal of a MOS transistor are interchangeable and, therefore, the drain (D) terminal of one transistor of an individual transistor pair ($Q_5$ 402 and $Q_6$ 404, $Q_7$ 412 and $Q_8$ 414, $Q_9$ 422 and $Q_{10}$ 424) may be connected to the source (S) terminal of the other transistor. In one or more embodiments, the voltages ($V_{DDIO}$ 406, bias voltage 410, and the IO pad 408 voltage) may be received at a source (S) terminal or a drain (D) terminal of an individual transistor pair ($Q_5$ 402 and $Q_6$ 404, $Q_7$ 412 and $Q_8$ 414, $Q_9$ 422 and $Q_{10}$ 424). In one or more embodiments, the drain-drain path in the individual transistor pairs ($Q_5$ 402 and $Q_6$ 404, $Q_7$ 412 and $Q_8$ 414, $Q_9$ 422 and $Q_{10}$ 424) may also be the drain-source path.

In one or more embodiments, during normal operation, the IO pad 408 voltage may vary from 0 to $V_{DDIO}$ 406, and the bias voltage 410 may be equal to a fraction of $V_{DDIO}$ 406 (e.g., 0.55VDDIO). In one or more embodiments, when the IO pad 408 voltage is low, $Q_7$ 412 may be turned ON and $Q_8$ 414 may be OFF. Therefore, the output of the second comparator block 304 may be equal to the bias voltage 410. In one or more embodiments, the output of the first comparator block 302 may be equal to $V_{DDIO}$ 406, where $Q_5$ 402 may be turned ON and $Q_6$ 404 may be OFF. In one or more embodiments, the output of the third comparator block 312, $V_{FW}$ 420, may be equal to $V_{DDIO}$ 406, where $Q_9$ 422 may be turned ON and $Q_{10}$ 424 may be OFF.

In one or more embodiments, when the IO pad 408 voltage is high, the output of the second comparator block 304 may be equal to the IO pad 408 voltage, where $Q_8$ 414 may be turned ON and $Q_7$ 412 may be OFF. Therefore, the output of the third comparator block 312 may be equal to the higher of $V_{DDIO}$ 406 (output of the first comparator block 302) and the IO pad 408 voltage (output of the second comparator block 304). This implies that $V_{FW}$ 420 may be equal to $V_{DDIO}$ 406 when the IO pad 408 voltage is high during the normal operation. Here again, $Q_9$ 422 may be turned ON and $Q_{10}$ 424 may be turned OFF.

In one or more embodiments, $V_{FW}$ 420 may be equal to $V_{DDIO}$ 406 during the normal operation, regardless of the value of the IO pad 408 voltage, which may swing from 0 to $V_{DDIO}$ 408.

In one or more embodiments, $V_{DDIO}$ 406 may be equal to 0 during a failsafe operation. In one or more embodiments, the bias voltage 410 may then be derived from the IO pad 408 voltage as per Equation 1.

In one or more embodiments, when the IO pad 408 voltage may be low, the output of the third comparator block 312, $V_{FW}$ 420, may be low. In one or more embodiments, when the IO pad 408 voltage may be high, the output of the second comparator block 304 may be equal to the IO pad 408 voltage, with $Q_8$ 414 turning ON and $Q_7$ 412 OFF. In one or more embodiments, the output of the first comparator block 302 may then be equal to the bias voltage 410, with $Q_6$ turning ON and $Q_5$ OFF. The bias voltage 410, as described in Equation 1, may need to be controlled to be less than an upper tolerable limit of each of the transistors ($Q_5$ 402 and $Q_6$ 404) of the first comparator block 302. For example, each constituent transistor ($Q_5$ 402 and $Q_6$ 404) of the first comparator block 302 may be a 1.8 V device and, therefore, the bias voltage 410 may need to be controlled to be less than ~2V (1.8V+10% upper tolerable limit) to ensure the safety of each constituent transistor ($Q_5$ 402 and $Q_6$ 404) of the first comparator block 302.

In one or more embodiments, the IO pad 408 voltage may be higher than $V_{DDIO}$ 406 during the tolerant mode of operation. In one or more embodiments, when the IO pad 408 voltage is higher than $V_{DDIO}$ 406, the bias voltage 410 may track the IO pad 408 voltage as per Equation 1. Here, the output of the second comparator block 304 may be equal to the IO pad 408 voltage, with $Q_8$ 414 turning ON and $Q_7$ 412 OFF. In one or more embodiments, the output of the first comparator block 302 may be equal to bias voltage 410 or $V_{DDIO}$ 406, depending on magnitudes thereof. Here, $Q_6$ 404 or $Q_5$ 402 may turn ON, and the other transistor may be OFF. In one or more embodiments, as the IO pad 408 voltage is higher than $V_{DDIO}$ 406, as discussed above, the output of the third comparator block 312, $V_{FW}$ 420, may be equal to the IO pad 408 voltage. Therefore, $Q_{10}$ may be ON and $Q_9$ OFF.

In one or more embodiments, when $V_{DDIO}$ 406 is higher than the IO pad 408 voltage, the output of the first comparator block 302 may be equal to $V_{DDIO}$ 406, and the output of the second comparator block 304 may be equal to IO pad 408 voltage. In one or more embodiments, the output of the third comparator block 312, $V_{FW}$ 420, may then be equal to $V_{DDIO}$ 406. Therefore, $Q_9$ may be ON and $Q_{10}$ OFF.

Therefore, in one or more embodiments, the output of the third comparator block 312, $V_{FW}$ 420, may be equal to $V_{DDIO}$ 406 or IO pad 408 voltage, depending on whichever one of $V_{DDIO}$ 406 and the IO pad 408 voltage is higher.

In one or more embodiments, the bias voltage 410 may be controlled such that $V_{FW}$ 420 is substantially equal to $V_{DDIO}$ 406 and/or the IO pad 408 voltage. In one or more embodiments, the voltage across each transistor of the comparator blocks (302, 304, and 312) may be controlled to be within an upper tolerable limit thereof during all of the normal, failsafe, and tolerant modes of operation. In one or more embodiments, interfacing low voltage devices (e.g., transistors) with a high supply voltage and/or a high voltage supplied through the IO pad may be possible through the provision of the FW circuit 300.

Figure 5:
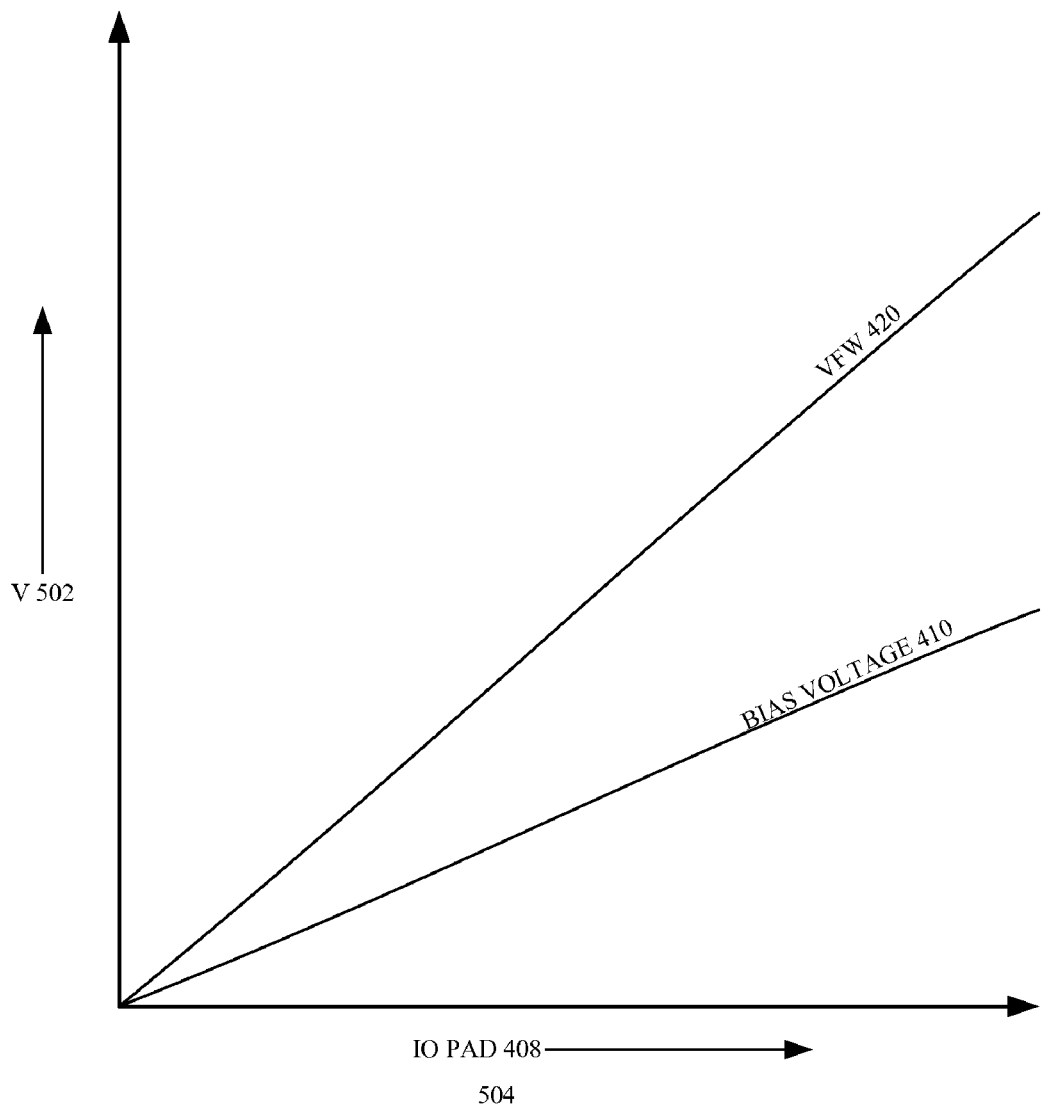
FIG. 5 is a plot of the DC characteristics of the FW circuit of FIG. 3 during a failsafe operation, according to one or more embodiments.

FIG. 5 shows the DC characteristics of the FW circuit 300 during the failsafe operation, according to one or more embodiments. As discussed above, $V_{DDIO}$ 406 is equal to 0 in the failsafe case. The x-axis 504 denotes the IO pad 408 voltage and the y-axis 502 denotes the variable voltages. In one or more embodiments, as IO pad 408 voltage is swept from 0, $V_{FW}$ 420 may follow the IO pad 408 voltage, as shown in FIG. 5. In one or more embodiments, bias voltage 410 may follow the IO pad 408 voltage as per Equation 1, as shown in FIG. 5.

Figure 6:
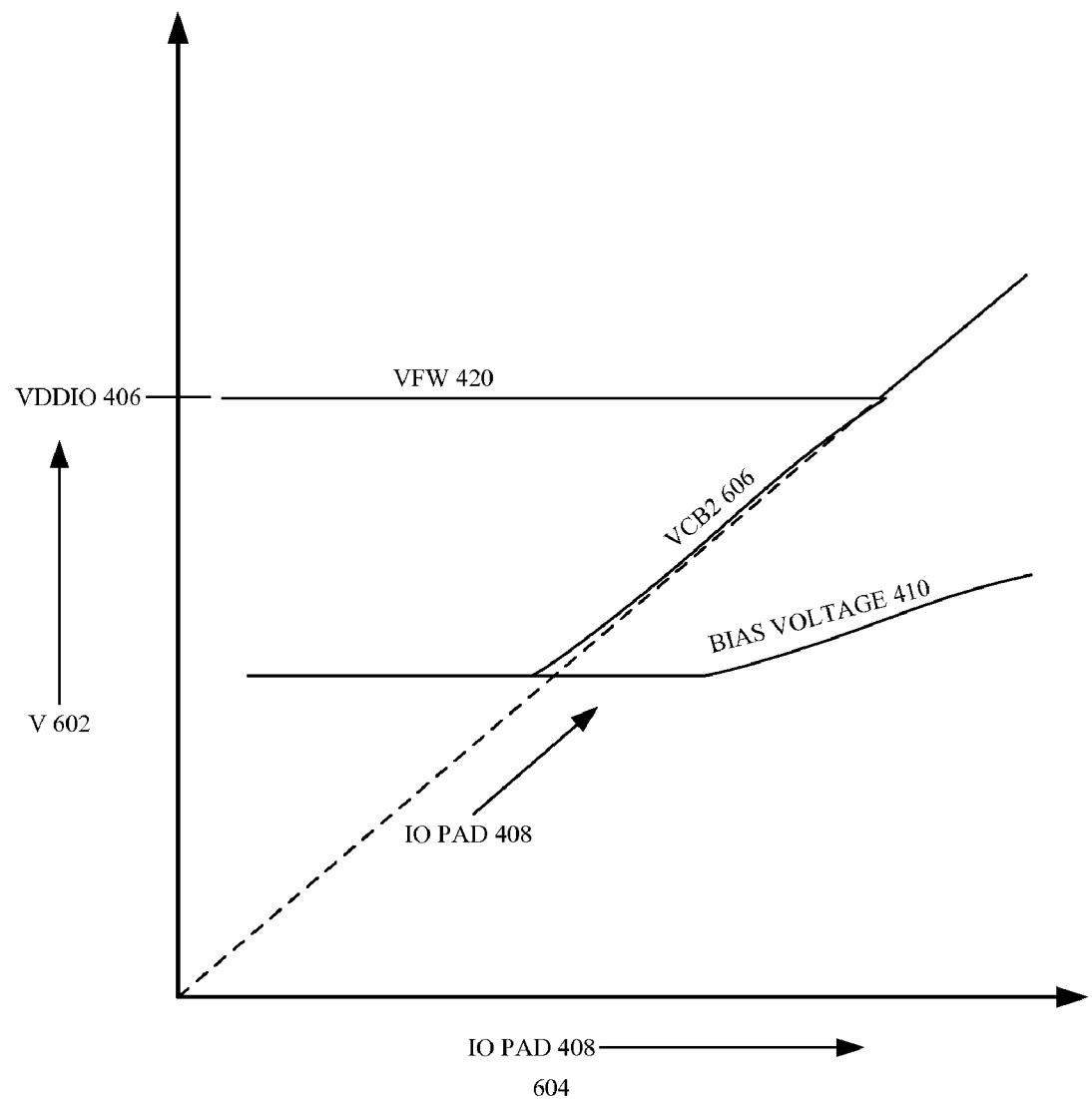
FIG. 6 is a plot of the DC characteristics of the FW circuit of FIG. 3 during a tolerant operation, according to one or more embodiments.

FIG. 6 shows the DC characteristics of the FW circuit 300 during the tolerant operation, according to one or more embodiments. The x-axis 604 denotes the IO pad voltage 408 and the y-axis 602 denotes the variable voltages. In one or more embodiments, as the IO pad 408 voltage is swept from 0, the bias voltage 410 may vary as shown in FIG. 6. In one or more embodiments, as the IO pad 408 voltage passes the bias voltage 410, the output of the second comparator block 304, $V_{CB2}$ 606, may be equal to the IO pad 408 voltage. Therefore, $V_{CB2}$ 606 may follow the IO pad 408 voltage after the IO pad 408 voltage passes the bias voltage 410.

In one or more embodiments, as long as $V_{DDIO}$ 406 is higher than the IO pad 408 voltage, the output of the third comparator block 312, $V_{FW}$ 420, may be equal to $V_{DDIO}$ 406, as shown in FIG. 6. In one or more embodiments, as the IO pad 408 voltage passes $V_{DDIO}$ 406, the output of the third comparator block 312, $V_{FW}$ 420 may switch to the IO pad 408 voltage. In one or more embodiments, the transistors of the comparator blocks (302, 304, and 312) may be designed such that the switching time between $V_{DDIO}$ 406 and the IO pad 408 voltage may be reduced.

Figure 7:
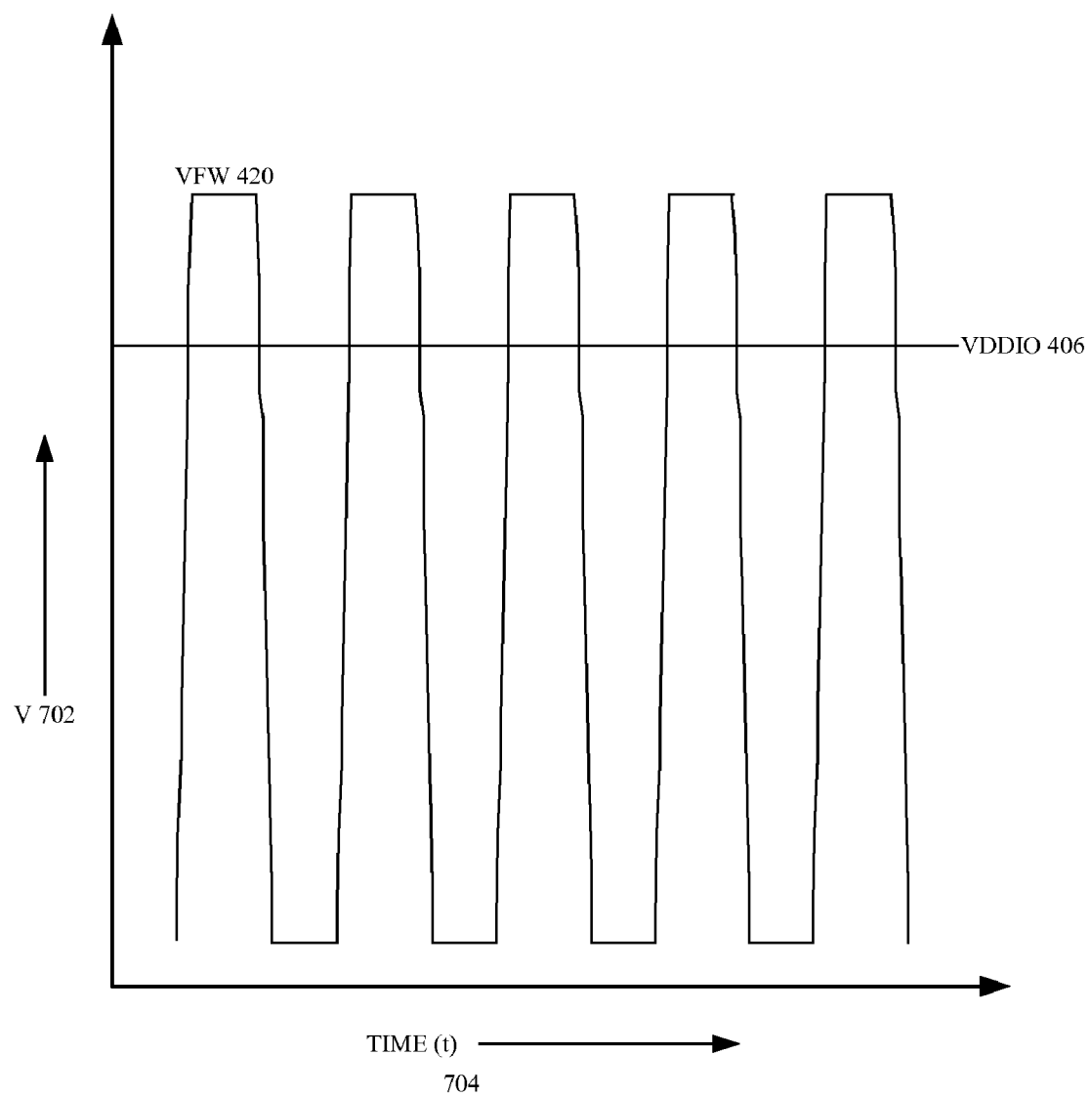
FIG. 7 is a plot of the transient characteristics of the FW circuit of FIG. 3 during the tolerant operation, according to one or more embodiments.

FIG. 7 shows the transient characteristics of the FW circuit 300 during the tolerant operation, according to one or more embodiments. The x-axis represents time (t) 704 and the y-axis 702 represents variable voltages. In one or more embodiments, as the IO pad 408 voltage is swept from 0, the output of the third comparator block 312, $V_{FW}$ 420, may be equal to $V_{DDIO}$ 406 as long as the IO pad 408 voltage is less than $V_{DDIO}$ 406. In one or more embodiments, as soon as the IO pad 408 voltage passes $V_{DDIO}$ 406, as shown in FIG. 7, $V_{FW}$ 420 may start tracking the IO pad 408 voltage.

Figure 8:
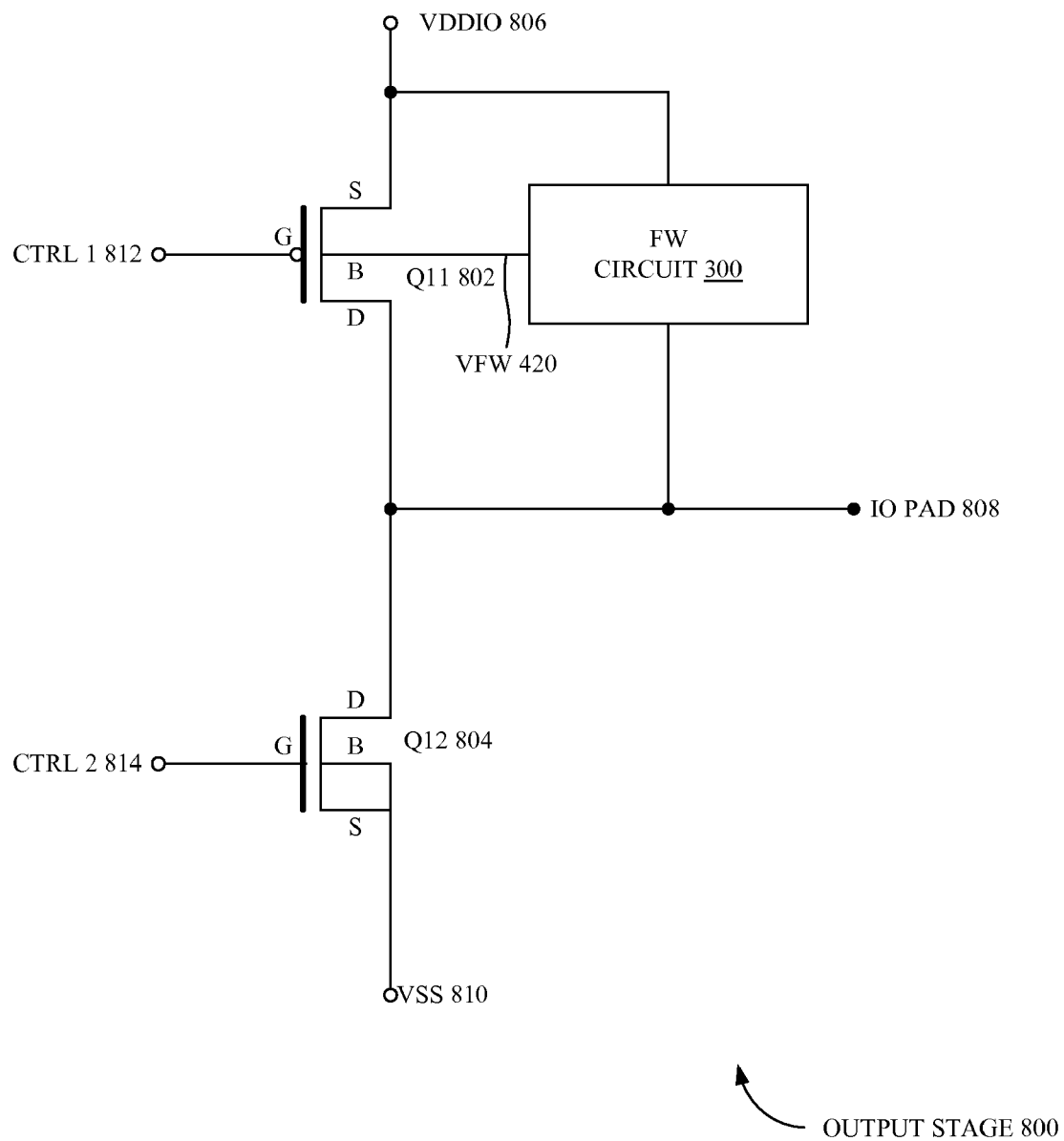
FIG. 8 is a schematic view of an output stage of a buffer circuit including the FW circuit of FIG. 3, according to one or more embodiments.

FIG. 8 shows an output stage 800 of a buffer circuit including the FW circuit 300, according to one or more embodiments. Here, $V_{DDIO}$ 806, $V_{SS}$ 810, IO pad 808 voltage, CTRL1 812, and CTRL2 814 are analogous to $V_{DDIO}$ (106, 206), $V_{SS}$ (110, 210), IO pad (108, 208) voltage, CTRL1 112, and CTRL2 114 of FIG. 1 and FIG. 2 respectively. PMOS transistors $Q_{11}$ 802 and $Q_{12}$ 804 are analogous to $Q_1$ 202 and $Q_2$ 204 of FIG. 2 respectively. In one or more embodiments, the output of the FW circuit 300, $V_{FW}$ 420, is shown as being applied to a bulk (B) terminal of $Q_{11}$ 802. In one or more embodiments, the FW circuit 300 may solve the fluctuating $V_{FW}$ 220 problem in FIG. 2.

In one or more embodiments, even if the FW circuit 300 discharges, the parasitic diode associated with $Q_{11}$ 802 may ensure that $V_{FW}$ 420 does not drop more than $V_T$ below $V_{FW}$ 420. In one or more embodiments, the provision of the FW circuit 300 in the output stage 800 of the buffer circuit may reduce stresses on constituent active elements (e.g., MOS transistors) of the core circuitry that the buffer circuit interfaces with an external IO circuit.

Figure 9:
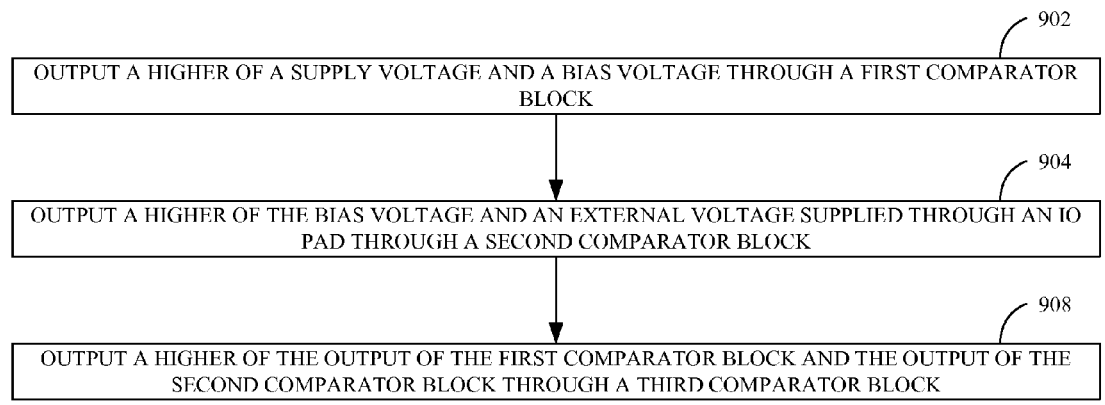
FIG. 9 is a process flow diagram detailing the operations involved in a method of realizing the FW circuit of FIG. 3, according to one or more embodiments.

FIG. 9 is a process flow diagram detailing the operations involved in a method of realizing the FW circuit 300, according to one or more embodiments. In one or more embodiments, operation 902 may involve outputting the higher of the supply voltage ($V_{DDIO}$ 406) and the bias voltage 410 through the first comparator block 302. In one or more embodiments, operation 904 may involve outputting the higher of the bias voltage 410 and the external voltage supplied through an IO pad (IO pad 408 voltage) through the second comparator block 304. In one or more embodiments, operation 906 may involve outputting the higher of the output of the first comparator block 302 and the output of the second comparator block 304 through the third comparator block 312.

In one or more embodiments, a voltage across a constituent active element (e.g., a MOS transistor) of each of the first comparator block 302, the second comparator block 304, and the third comparator block 312 may be within an upper tolerable limit thereof during each of the normal operation, the failsafe operation, and the tolerant operation. In one or more embodiments, the failsafe operation may be a mode where the supply voltage ($V_{DDIO}$ 406) is zero, and the tolerant operation may be a mode where the external voltage supplied through the IO pad (IO pad 408 voltage) varies from zero to a value higher than the supply voltage.

Although the present embodiments have been described with reference to specific example embodiments, it will be evident that various modifications and changes may be made to these embodiments without departing from the broader spirit and scope of the various embodiments. For example, variations in operating voltages and/or external voltages are within the scope of the exemplary embodiments. Also, for example, the various devices and modules described herein may be enabled and operated using hardware circuitry (e.g., CMOS based logic circuitry), firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer devices), and may be performed in any order (e.g., including using means for achieving the various operations). Accordingly, the specification and drawings are to be regarded in an illustrative rather than a restrictive sense.

What is claimed is:

1. A circuit comprising:
   a first comparator block configured to output a voltage equal to a higher of a supply voltage and a bias voltage;
   a second comparator block configured to output a voltage equal to a higher of the bias voltage and an external voltage supplied through an Input/Output (IO) pad; and
   a third comparator block configured to output a voltage equal to a higher of the output of the first comparator block and the output of the second comparator block,
   wherein a voltage across at least one constituent active element of each of the first comparator block, the second comparator block, and the third comparator block is within an upper tolerable limit thereof during each of a normal operation, a failsafe operation, and a tolerant operation,
   wherein the failsafe operation is a mode where the supply voltage is zero, and
   wherein the tolerant operation is a mode where the external voltage supplied through the IO pad varies from zero to a value higher than the supply voltage.

2. The circuit of claim 1, wherein the bias voltage tracks the external voltage supplied through the IO pad during the tolerant operation.

3. The circuit of claim 1, wherein the bias voltage is controllably generated externally to be a fraction of the supply voltage during the normal operation.

4. The circuit of claim 1, wherein the bias voltage is ensured to be within the upper tolerable limit of the at least one constituent active element of the first comparator block during the failsafe operation.

5. The circuit of claim 1, wherein the at least one constituent active element of each of the first comparator block, the second comparator block, and the third comparator block is a Metal-Oxide-Semiconductor (MOS) transistor.

6. The circuit of claim 5, wherein the first comparator block, the second comparator block, and the third comparator block each comprise:
   a first PMOS transistor configured to receive a first voltage at one of a source terminal and a drain terminal thereof; and
   a second PMOS transistor configured to receive a second voltage at one of a source terminal and a drain terminal thereof,
   wherein the one of the source terminal and the drain terminal of the first PMOS transistor not configured to receive the first voltage is coupled to the one of the source terminal and the drain terminal of the second PMOS transistor not configured to receive the second voltage,
   wherein a bulk terminal of the first PMOS transistor is configured to be coupled to a bulk terminal of the second PMOS transistor,
   wherein a gate terminal of the first PMOS transistor is configured to be coupled to the one of the source terminal and the drain terminal of the second PMOS transistor configured to receive the second voltage, and
   wherein a gate terminal of the second PMOS transistor is configured to be coupled to the one of the source terminal and the drain terminal of the first PMOS transistor configured to receive the first voltage.

7. The circuit of claim 6, wherein the bias voltage is controlled such that the output of the third comparator block is substantially equal to at least one of the supply voltage and the external voltage supplied through the IO pad.

8. The circuit of claim 6, wherein the output voltage of the third comparator block is configured to be applied to a bulk terminal of a MOS transistor of an output stage of a buffer circuit.

9. The circuit of claim 6, wherein the path configured to couple the bulk terminals of the first PMOS transistor and the second PMOS transistor is configured to be shorted with the path configured to couple the one of the source terminal and the drain terminal of the first PMOS transistor not configured to receive the first voltage and the one of the source terminal and the drain terminal of the second PMOS transistor not configured to receive the second voltage.

10. A method comprising:
    outputting a higher of a supply voltage and a bias voltage through a first comparator block;
    outputting a higher of the bias voltage and an external voltage supplied through an IO pad through a second comparator block; and
    outputting a higher of the output of the first comparator block and the output of the second comparator block through a third comparator block, a voltage across at least one constituent active element of each of the first comparator block, the second comparator block, and the third comparator block being within an upper tolerable limit thereof during each of a normal operation, a failsafe operation, and a tolerant operation,
    wherein the failsafe operation is a mode where the supply voltage is zero, and the tolerant operation is a mode where the external voltage supplied through the IO pad varies from zero to a value higher than the supply voltage.

11. The method of claim 10, further comprising controllably generating externally a fraction of the supply voltage as the bias voltage during the normal operation.

12. The method of claim 10, further comprising ensuring the bias voltage to be within the upper tolerable limit of the at least one constituent active element of the first comparator block during the failsafe operation.

13. The method of claim 10, further comprising forming each of the first comparator block, the second comparator block, and the third comparator block by:
    configuring a first PMOS transistor to receive a first voltage at one of a source terminal and a drain terminal thereof;
    configuring a second PMOS transistor to receive a second voltage at one of a source terminal and a drain terminal thereof;
    coupling one of the source terminal and the drain terminal of the first PMOS transistor not receiving the first voltage to one of the source terminal and the drain terminal of the second PMOS transistor not receiving the second voltage;
    coupling a bulk terminal of the first PMOS transistor to a bulk terminal of the second PMOS transistor;

coupling a gate terminal of the first PMOS transistor to the one of the source terminal and the drain terminal of the second PMOS transistor receiving the second voltage; and coupling a gate terminal of the second PMOS transistor to the one of the source terminal and the drain terminal of the first PMOS transistor receiving the first voltage.

14. The method of claim 13, further comprising applying the output voltage of the third comparator block to a bulk terminal of a MOS transistor of an output stage of a buffer circuit.

15. The method of claim 13, further comprising controlling the bias voltage such that the output voltage of the third comparator block is substantially equal to at least one of the supply voltage and the external voltage supplied through the IO pad.

16. The method of claim 13, further comprising shorting the path coupling the bulk terminals of the first PMOS transistor and the second PMOS transistor with the path coupling the one of the source terminal and the drain terminal of the first PMOS transistor not receiving the first voltage and the one of the source terminal and the drain terminal of the second PMOS transistor not receiving the second voltage.

17. A buffer circuit comprising:
an output stage comprising a floating well circuit, the floating well circuit comprising:
a first comparator block configured to output a voltage equal to a higher of a supply voltage and a bias voltage;
a second comparator block configured to output a voltage equal to a higher of the bias voltage and an external voltage supplied through an IO pad; and
a third comparator block configured to output a voltage equal to a higher of the output of the first comparator block and the output of the second comparator block,
wherein a voltage across at least one constituent active element of each of the first comparator block, the second comparator block, and the third comparator block is within an upper tolerable limit thereof during each of a normal operation, a failsafe operation, and a tolerant operation,
wherein the failsafe operation is a mode where the supply voltage is zero,
wherein the tolerant operation is a mode where the external voltage supplied through the IO pad varies from zero to a value higher than the supply voltage, and
wherein the output voltage of the third comparator block of the floating well circuit is configured to be applied to a substrate of a constituent active element of the output stage of the buffer circuit.

18. The buffer circuit of claim 17, wherein the constituent active element of the output stage of the buffer circuit is configured to be driven by a control signal generated from a control circuit of the buffer circuit.

19. The buffer circuit of claim 17, wherein the constituent active element of the output stage of the buffer circuit and the at least one constituent active element of each of the first comparator block, the second comparator block, and the third comparator block are MOS transistors.

20. The buffer circuit of claim 19, wherein the first comparator block, the second comparator block, and the third comparator block each comprise:
a first PMOS transistor configured to receive a first voltage at one of a source terminal and a drain terminal thereof; and
a second PMOS transistor configured to receive a second voltage at one of a source terminal and a drain terminal thereof,
wherein the one of the source terminal and the drain terminal of the first PMOS transistor not configured to receive the first voltage is coupled to the one of the source terminal and the drain terminal of the second PMOS transistor not configured to receive the second voltage,
wherein a bulk terminal of the first PMOS transistor is configured to be coupled to a bulk terminal of the second PMOS transistor,
wherein a gate terminal of the first PMOS transistor is configured to be coupled to the one of the source terminal and the drain terminal of the second PMOS transistor configured to receive the second voltage, and
wherein a gate terminal of the second PMOS transistor is coupled to the one of the source terminal and the drain terminal of the first PMOS transistor configured to receive the first voltage.

* * * * *